(12) United States Patent
Brantweiner et al.

(10) Patent No.: US 9,214,620 B2
(45) Date of Patent: Dec. 15, 2015

(54) PIEZOELECTRIC ACTUATOR WITH OUTER ELECTRODE

(75) Inventors: Stefan Brantweiner, Bad Gams (AT); Siegfried Fellner, St. Georgen (AT)

(73) Assignee: EPCOS AG, Munich (DE)

( * ) Notice: Subject to any disclaimer, the term of this patent is extended or adjusted under 35 U.S.C. 154(b) by 297 days.

(21) Appl. No.: 13/122,918

(22) PCT Filed: Oct. 2, 2009

(86) PCT No.: PCT/EP2009/062835
§ 371 (c)(1),
(2), (4) Date: Jun. 28, 2011

(87) PCT Pub. No.: WO2010/040693
PCT Pub. Date: Apr. 15, 2010

(65) Prior Publication Data
US 2011/0248607 A1 Oct. 13, 2011

(30) Foreign Application Priority Data
Oct. 6, 2008 (DE) .......................... 10 2008 050 539

(51) Int. Cl.
*H01L 41/04* (2006.01)
*H01L 41/047* (2006.01)
*H01L 41/083* (2006.01)

(52) U.S. Cl.
CPC ........ *H01L 41/0472* (2013.01); *H01L 41/0475* (2013.01); *H01L 41/083* (2013.01)

(58) Field of Classification Search
CPC .............. H01L 41/0472; H01L 41/083; H01L 41/0475
USPC .............. 310/363–366, 328, 311; 251/129.04
IPC ...................... H01L 41/083,41/047; H01F 7/18
See application file for complete search history.

(56) References Cited

U.S. PATENT DOCUMENTS

| | | | |
|---|---|---|---|
| 6,208,026 B1 * | 3/2001 | Bindig et al. | 310/363 |
| 6,316,863 B1 * | 11/2001 | Schuh et al. | 310/328 |
| 7,015,629 B2 | 3/2006 | Lubitz et al. | |
| 7,259,504 B2 | 8/2007 | Schürz et al. | |
| 7,276,837 B2 | 10/2007 | Boecking | |
| 7,564,169 B2 | 7/2009 | Döllgast et al. | |
| 7,605,520 B2 | 10/2009 | Schürz et al. | |
| 7,612,487 B2 | 11/2009 | Döllgast et al. | |
| 7,851,979 B2 | 12/2010 | Kronberger | |
| 8,638,025 B2 * | 1/2014 | Gabl et al. | 310/328 |
| 8,823,245 B2 * | 9/2014 | Rinner et al. | 310/328 |
| 2006/0125353 A1 * | 6/2006 | Boecking | 310/366 |
| 2011/0248607 A1 * | 10/2011 | Brantweiner et al. | 310/366 |

(Continued)

FOREIGN PATENT DOCUMENTS

| | | |
|---|---|---|
| DE | 199 45 933 C1 | 5/2001 |
| DE | 102 59 949 A1 | 7/2004 |

(Continued)

*Primary Examiner* — Thomas Dougherty
*Assistant Examiner* — Karen B Addison
(74) *Attorney, Agent, or Firm* — Slater & Matsil, L.L.P.

(57) ABSTRACT

A piezoelectric actuator of a multilayer design has a stack of piezoelectric layers and electrode layers arranged in between. The electrode layers are contacted by way of two outer electrodes, which have a multiplicity of wires. The outer electrodes are fastened in fastening regions on first side faces of the stack and are led around the edge of the stack that is closest to the respective fastening region.

19 Claims, 3 Drawing Sheets

(56) References Cited

U.S. PATENT DOCUMENTS

| | | |
|---|---|---|
| 2012/0019107 A1* | 1/2012 | Gabl et al. .................... 310/363 |
| 2012/0202382 A1* | 8/2012 | Gabl et al. ............... 439/620.24 |
| 2012/0280593 A1* | 11/2012 | Rinner et al. ................. 310/311 |

FOREIGN PATENT DOCUMENTS

| | | |
|---|---|---|
| DE | 102004031404 A1 | 2/2006 |
| DE | 10 2006 006 077 A1 | 8/2007 |
| DE | 10 2006 032 743 A1 | 1/2008 |
| JP | 2001-519094 A | 10/2001 |
| JP | 2007-527972 A | 10/2007 |
| WO | 9847187 A1 | 10/1998 |
| WO | WO 02/089226 A2 | 11/2002 |
| WO | WO 2004/004021 A2 | 1/2004 |
| WO | WO 2004/027887 A2 | 4/2004 |
| WO | WO 2005/027235 A1 | 3/2005 |
| WO | WO 2005/035971 A1 | 4/2005 |
| WO | WO 2005/047689 A1 | 5/2005 |
| WO | WO 2005/048365 A1 | 5/2005 |
| WO | 2005088744 A1 | 9/2005 |
| WO | WO 2005/124884 A1 | 12/2005 |

* cited by examiner

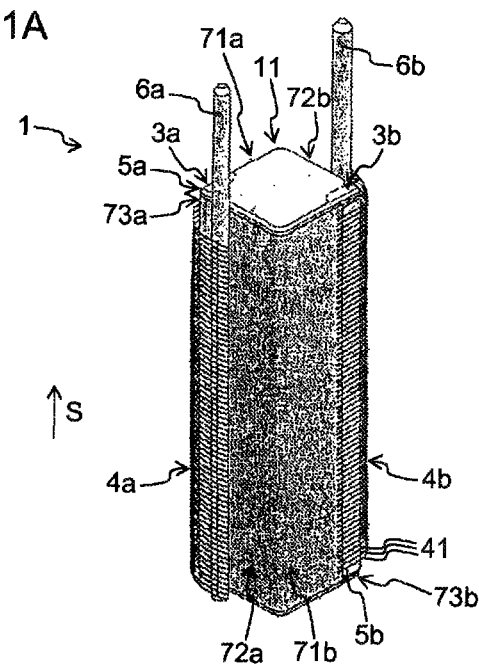
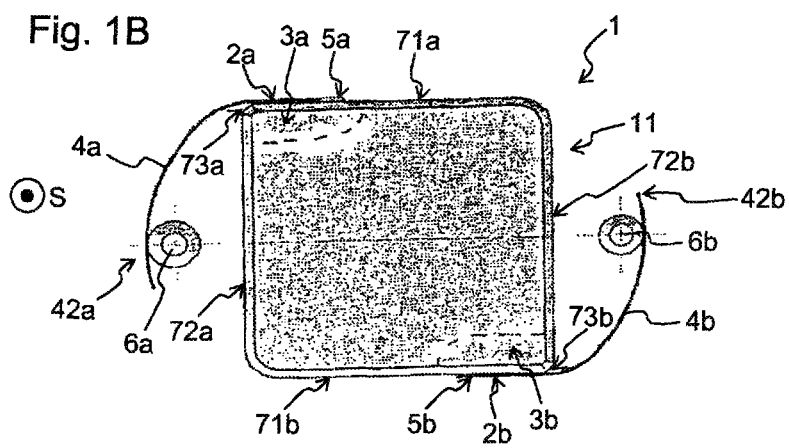

PIEZOELECTRIC ACTUATOR WITH OUTER ELECTRODE

This patent application is a national phase filing under section 371 of PCT/EP2009/062835, filed Oct. 2, 2009, which claims the priority of German patent application 10 2008 050 539.0, filed Oct. 6, 2008, each of which is incorporated herein by reference in its entirety.

BACKGROUND

A piezoelectric actuator of a multilayer design which is made up of a multiplicity of piezoelectric layers with electrode layers lying in between is specified. When an electric voltage is applied to the electrode layers, the piezoelectric layers expand, thereby producing a stroke. Piezoelectric actuators of this type are used, for example, for actuating an injection valve in a motor vehicle. For the piezoelectric actuator to operate reliably, the electrode layers must be electrically contacted in a dependable manner. It is also necessary to prevent short-circuits between electrode layers of different polarity.

The German publication 19945933 C1 and WO 2005/035971 A1 disclose piezoelectric actuators in which the electrical contacting of the inner electrodes is performed by means of a so-called wire harp.

SUMMARY OF THE INVENTION

In one aspect, the present invention specifies a piezoelectric actuator with an outer electrode that can be produced at low cost and is highly reliable with respect to short-circuits.

A piezoelectric actuator of a multilayer design with a stack of piezoelectric layers and electrode layers arranged in between is specified. The electrode layers are electrically contacted by way of two outer electrodes. At least one outer electrode has a multiplicity of wires.

By means of an outer electrode of this type, the electrode layers can be electrically contacted in a reliable manner. Preferably, the wires are arranged in the form of a wire harp, i.e., they are arranged in a row and run parallel to one another. An outer electrode comprising a multiplicity of wires is preferably deformable, so that it is less susceptible to cracks in the electrode and, in addition, is well able to bridge cracks in the piezoelectric actuator. Should a crack nevertheless occur in a wire, the probability of the crack spreading into further wires is low. Consequently, dependable electrical contacting can be ensured.

The wires are fastened in a fastening region on a first side face of the stack and are led around the edge of the stack that lies closest to the fastening region.

A fastening region is a region of the surface of the stack at which the wires are firmly connected to the stack. For example, the wires are soldered to a base metallization that has been applied on the surface of the stack. The fastening region may also be made up of a number of partial regions of the surface.

By leading the wires around an edge of the stack, the outer electrode is adapted to the outer form of the stack. For example, the wires are led around the longitudinal edge of the stack. The fact that the wires are led around that edge of the stack that lies closest to the fastening region means that the required length of the wires is small, and consequently this embodiment is particularly inexpensive.

Preferably, the wires run perpendicularly to the stacking direction of the piezoelectric layers.

In the case of such an arrangement, only a small wire length is necessary and, moreover, mechanical stresses can be compensated particularly well. If the piezoelectric actuator expands in the stacking direction, no, or only minor, mechanical stresses occur here in the outer electrode. Moreover, if cracks occur perpendicularly to the stacking direction, the probability of a portion of the wire of the outer electrode being affected by this is low.

Preferably, the lengths of the wires in the region of the first side face is less than or equal to half the width of the first side face.

In a preferred embodiment, the fastening region is chosen such that chafing of the wires on the edges of the stack can be avoided.

For example, the fastening region is adjacent to the closest edge.

In this case, the wires are fixed to the stack in the region of the edge, so that they move along with the stack when the stack expands. Consequently, in the region of the edge, the wires do not undergo any relative movement with respect to the edge and, as a result, cannot chafe on the edge. Chafing of the wires on the stack could lead to cracks in the wires and to failure of the electrical contacting. Moreover, the edge of the stack that is concerned may be damaged, so that a short-circuit between the electrode layers may occur.

Preferably, in the region of the first side face, the wires are connected to the stack throughout.

In this way, a reliable connection of the outer electrodes to the stack can be achieved.

Preferably, beyond the first side face, the wires are bent, so that they run at least partially parallel to a second side face that is adjacent to the edge.

The fact that the wires run parallel to the second side face means that the outer electrode is adapted to the outer form of the stack, and consequently space-saving electrical contacting is achieved.

Preferably, beyond the edge, the wires are at a distance from the second side face. In particular, it is of advantage if the wires do not touch the second side face.

This has the advantage that the wires cannot chafe on the second side face of the piezoelectric actuator. Moreover, a further contacting means, for example, in the form of a contact pin, may be arranged between the outer electrode and the piezoelectric actuator. Preferably, the contact pin is arranged at a distance from the stack. In this way, wear of the piezoelectric actuator as a result of the contact pin rubbing against the surface of the stack can be avoided.

Preferably, the piezoelectric actuator is a monolithic multilayer actuator which is produced from thin sheets of a piezoelectric material, for example, lead-zirconate-titanate (PZT). To form the electrode layers, a metal paste, for example, a silver-palladium paste, may be applied to the sheets by means of a screen printing process. The sheets are subsequently stacked one on top of the other, pressed and sintered at one and the same time. The electrode layers are preferably connected to two outer electrodes in an alternating manner along the stacking direction of the piezoelectric actuator.

For this purpose, in a preferred embodiment, the electrode layers are led out in an alternating manner in the stacking direction onto a region of a side face and are at a distance from a region of a further side face. This has the effect of forming inactive zones in the stack, zones in which adjacent electrode layers of different polarity do not overlap in the stacking direction. Preferably, an inactive zone extends in a plane perpendicular to the stacking direction only over a partial region of a side face, for example, over a region that is adjacent to an edge of the stack. The fact that the inactive zones do not extend over an entire side face, but only over a partial region of a side face, means that mechanical stresses can be kept small.

For the electrical contacting of the electrode layers, conductive layers which extend over the stack along the stacking direction may be applied to the side faces adjacent to inactive zones. For example, with a corresponding arrangement of the inactive zones, the conductive layers are located on two opposing side faces of the stack and are adjacent to two diagonally opposing longitudinal edges of the stack. The wires of an outer electrode may be fastened to the conductive layers, for example, by means of soldering or welding. For example, the wires are connected to a conductive layer by means of a solder layer.

In the case of an alternative embodiment of the piezoelectric actuator, the electrode layers extend over the entire cross-sectional area of the stack. This has the advantage that no inactive zones are formed in the stack, and consequently mechanical stresses are reduced. In this case, the electrode layers may be connected to the outer electrodes of different polarity in an alternating manner along the stacking direction of the piezoelectric actuator by each electrode layer being electrically connected separately to a wire of an outer electrode. Along the stacking direction, the electrode layers are then contacted in an alternating manner to a wire of the first outer electrode and a wire of the second outer electrode.

At its free end, the outer electrode is electrically connected, for example, by means of a contact pin, which is preferably aligned parallel to the stacking direction.

This achieves particularly space-saving contacting of the piezoelectric actuator. The electrical connection of the electrode layers and the contact pin by means of wires has the effect of mechanically decoupling the contact pin sufficiently from the piezoelectric actuator.

BRIEF DESCRIPTION OF THE DRAWINGS

The specified piezoelectric actuator and advantageous configurations thereof are explained below on the basis of schematic figures that are not to scale and in which:

FIG. 1A shows a piezoelectric actuator in a perspective view;

FIG. 1B shows a piezoelectric actuator according to FIG. 1A in a cross section perpendicular to the stacking direction;

DETAILED DESCRIPTION OF ILLUSTRATIVE EMBODIMENTS

Figure 2A:
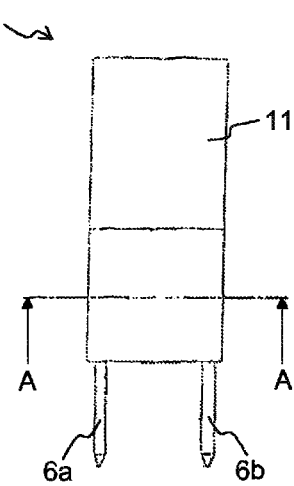
FIG. 2A shows a piezoelectric actuator in the section along the stacking direction.

FIG. 1A shows a piezoelectric actuator 1 of a multilayer design, in which a multiplicity of piezoelectric layers and electrode layers lying in between are arranged along a stacking direction S to form a stack 11. FIG. 1B shows a view of a piezoelectric actuator of this type.

The stack 11 has two inactive zones 3a, 3b, in which electrode layers of different polarity that are adjacent in the stacking direction S do not overlap. For this purpose, the electrode layers are alternately not led out to a region of a side face 71a and an opposing side face 71b. The inactive zones 3a, 3b only extend in each case over a partial region of two first side faces 71a, 71b and reach in each case over a longitudinal edge 73a, 73b of the stack 11.

For the electrical contacting of the electrode layers, conductive layers 5a, 5b in strip form have been applied on two first side faces 71a, 71b of the stack 11. The conductive layers 5a, 5b are base metallizations, which are produced in a way analogous to the electrode layers by means of a firing paste. The conductive layers 5a, 5b are adjacent to the inactive zones 3a, 3b and extend over the entire length of the stack 11. Soldered onto each conductive layer 5a, 5b is an outer electrode 4a, 4b.

Each outer electrode 4a, 4b has a multiplicity of wires 41, which run perpendicularly to the stacking direction S. On first side faces 71a, 71b, the wires 41 are fastened in fastening regions 2a, 2b to conductive layers 5a, 5b and are led around the adjacent longitudinal edges 73a, 73b. The fastening regions 2a, 2b are adjacent to the closest longitudinal edges 73a, 73b. Consequently, chafing of the wires 41 on the longitudinal edges 73a, 73b, and therefore wear as a result of the wires 41 rubbing directly against the longitudinal edges 73a, 73b, can be prevented. In the region of the first side face 71a, 71b, the wires 41 are connected to the stack 11 throughout.

In the region of a second side face 72a, 72b, the free end 42a, 42b of each outer electrode 4a, 4b is connected to a contact pin 6a, 6b. The contact pins 6a, 6b are kept at a distance from the second side faces 72a, 72b, so that chafing of the contact pins 6a, 6b on the side faces 72a, 72b is prevented.

The outer electrodes 5a, 5b are in each case led around the longitudinal edge 73a, 73b, which is adjacent to the conductive layer 5a, 5b on the first side face 71a, 71b, respectively.

Beyond the longitudinal edge 73a, 73b, at least in a partial region, the wires 41 run parallel to a second side face 72a, 72b that is adjacent to the longitudinal edge 73a, 73b and are at a distance from the second side face 72a, 72b. As a result, chafing of the wires 41 on the second side faces 72a, 72b of the piezoelectric actuator 1 is prevented. The free end 42a, 42b of an outer electrode 4a, 4b is connected to a contact pin 6a, 6b, which is arranged between the respective outer electrode 4a, 4b and the second side face 72a, 72b. The contact pins 6a, 6b extend along the stacking direction. The wires 41 end level with the middle of the respective second side face 72a, 72b.

Figure 2B:
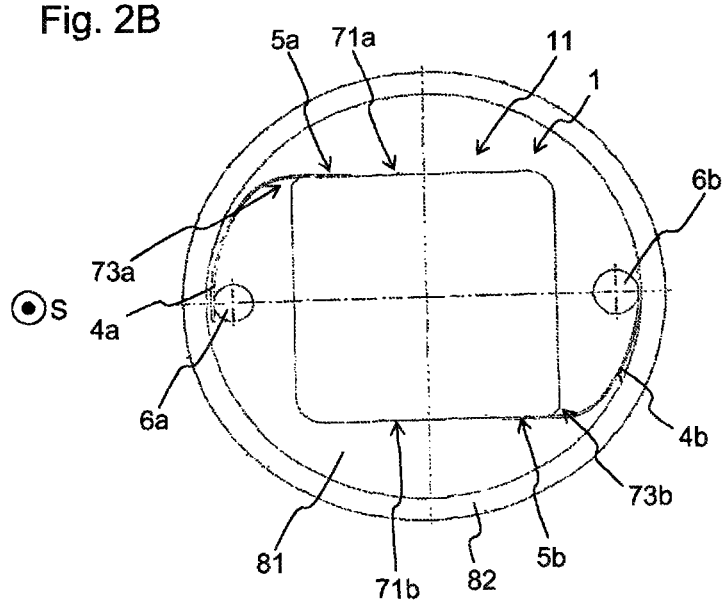
FIG. 2B shows an embodiment for outer contacting of a piezoelectric actuator in the cross section perpendicular to the stacking direction.

FIG. 2B shows a first embodiment for outer contacting of a piezoelectric actuator in the cross section perpendicular to the stacking direction. The cross section is taken here along the line depicted in FIG. 2A and can be seen in a view corresponding to the arrows identified by A. The piezoelectric actuator 1 is cast by means of a casting compound 81, for example, silicone, and surrounded by a plastic sleeve 82. By means of the casting compound, the piezoelectric actuator 1 and the contact pins 6a, 6b can be fixed in a desired position.

Figure 3A:
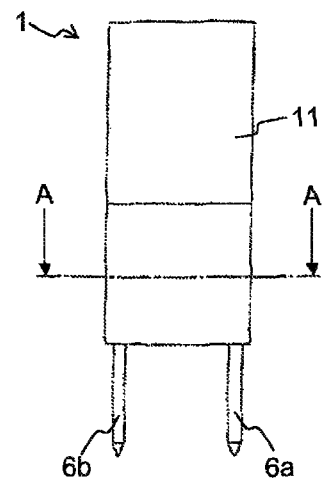
FIG. 3A shows a piezoelectric actuator in the section along the stacking direction.
Figure 3B:
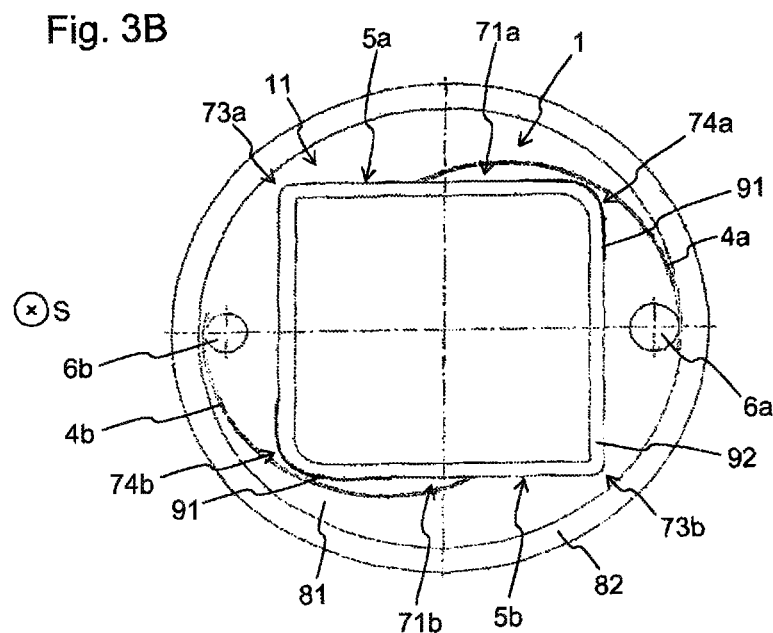
FIG. 3B shows an alternative embodiment for outer contacting of a piezoelectric actuator in the cross section perpendicular to the stacking direction.

FIG. 3B shows an alternative embodiment for outer contacting of a piezoelectric actuator 1 in the cross section perpendicular to the stacking direction S. The cross section is taken here along the line depicted in FIG. 3A and can be seen in a view corresponding to the arrows identified by A.

In the case of this embodiment, the outer electrodes 4a, 4b are likewise fastened to conductive layers 5a, 5b, which are located in the region of longitudinal edges 73a, 73b of the stack 11. However, here the outer electrodes 4a, 4b are in each case led around that longitudinal edge 74a, 74b that is not adjacent to the conductive layers 5a, 5b.

In this case, moreover, the outer electrodes 4a, 4b are not firmly connected to the first side face 71a, 71b, respectively, but to some extent lift off from it. This has the effect that, when there is an expansion of the stack, the outer electrodes 4a, 4b move in relation to the stack 11 in the region of the first side faces 71a, 71b and the longitudinal edges 74a, 74b, and so can chafe on the side face or an edge of the stack 11. To protect it from damage, the stack 11 is surrounded on its side faces 71a, 71b, 72a, 72b by a passivation layer 92. To provide protection, Kapton films 91 have additionally been applied to the longitudinal edges 74a, 74b, around which the outer electrodes 4a, 4b are led.

By contrast to this, no passivation layer 92 and no Kapton film 91 is necessary in the embodiment shown in FIG. 2B, since chafing of the wires 41 can already be prevented here by the arrangement of the outer electrodes 4a, 4b on the stack 11. Moreover, when the outer electrode 4a, 4b is led around the longitudinal edge 73a, 74b, which is adjacent to the respective conductive layer 5a, 5b, a shorter length of wire is required than in the case of the exemplary embodiment shown in FIG. 3B. Consequently, the outer contacting shown in FIG. 2B is particularly inexpensive.

The invention is not restricted by the description on the basis of the exemplary embodiments to these embodiments but comprises each novel feature and any combination of features. This includes in particular any combination of features in the patent claims, even if this feature or this combination itself is not explicitly specified in the patent claims or exemplary embodiments.

The following list of reference symbols may be used in conjunction with the drawings:
1 piezoelectric actuator
11 stack
2a, 2b fastening region
3a, 3b inactive zone
4a, 4b outer electrode
41 wire
42a, 42b free end
5a, 5b conductive layer
6a, 6b contact pin
71a, 71b first side face
72a, 72b second side face
73a, 73b, 74a, 74b longitudinal edge
81 casting compound
82 plastic sleeve
91 Kapton film
92 passivation layer
S stacking direction

The invention claimed is:

1. A piezoelectric actuator of a multilayer design, the piezoelectric actuator comprising:
   a stack comprising piezoelectric layers and electrode layers arranged between the piezoelectric layers, the stack having a stacking direction; and
   two outer electrodes for electrical contacting of the electrode layers,
   wherein at least one outer electrode has a plurality of wires,
   wherein the wires are fastened in a fastening region on a first side face of the stack but not on a second side face of the stack and wherein the wires are led around an edge that lies closest to the fastening region,
   wherein, beyond the first side face, the wires are bent, so that they run at least partially parallel to the second side face that is adjacent to the edge, and
   wherein, beyond the edge, the wires are at a distance from the second side face.

2. The piezoelectric actuator according to claim 1, wherein the wires run perpendicularly to the stacking direction.

3. The piezoelectric actuator according to claim 2, wherein the wires in the fastening region of the first side face are less than or equal to half a width of the first side face.

4. The piezoelectric actuator according to claim 1, wherein the fastening region is adjacent to the edge that lies closest to the fastening region.

5. The piezoelectric actuator according to claim 4, wherein, in the fastening region of the first side face, the wires are connected to the stack throughout.

6. The piezoelectric actuator according to claim 1, wherein a free end of the outer electrode is connected to a contact pin that is aligned parallel to the stacking direction.

7. The piezoelectric actuator according to claim 6, wherein the contact pin is arranged at a distance from the stack.

8. The piezoelectric actuator according to claim 1, wherein the wires are fastened to a conductive layer in strip form, which extends over the stack along the stacking direction.

9. The piezoelectric actuator according to claim 8, wherein the wires are connected to the conductive layer by a solder layer.

10. The piezoelectric actuator according to claim 8, further comprising:
    two conductive layers in strip form,
    wherein the electrode layers are electrically connected to one of the conductive layers in an alternating manner along the stacking direction.

11. The piezoelectric actuator according to claim 1, wherein the piezoelectric actuator is cast with a casting compound.

12. The piezoelectric actuator according to claim 1, wherein the piezoelectric and electrode layers of the stack have characteristics of having been produced by sintering all the layers of the stack at one and the same time.

13. The piezoelectric actuator according to claim 1, wherein the wires end level with a middle of the second side face.

14. A piezoelectric actuator of a multilayer design, the piezoelectric actuator comprising:
    a stack comprising piezoelectric layers and electrode layers arranged between the piezoelectric layers, the stack having a stacking direction; and
    two outer electrodes for electrical contacting of the electrode layers,
    wherein at least one outer electrode has a plurality of wires,
    wherein the wires are fastened in a fastening region on a first side face of the stack and are led around an edge that lies closest to the fastening region,
    wherein, beyond the first side face, the wires are bent so that they run at least partially parallel to a second side face that is adjacent to the edge, and that a free end of the outer electrode is connected to a contact pin that is aligned parallel to the stacking direction, and
    wherein the contact pin is arranged at a distance from the second side face on a level with a middle of the second side face.

15. The piezoelectric actuator according to claim 14, wherein a surface normal through the middle of the second side face runs through the contact pin.

16. A piezoelectric actuator of a multilayer design, the piezoelectric actuator comprising:
    a stack comprising piezoelectric layers and electrode layers arranged between the piezoelectric layers, the stack having a stacking direction, a first edge formed by a first side face and a second side face, and a second edge formed by a further first side face and a further second side face;

a first contact pin arranged parallel to the stacking direction, wherein the first contact pin is located substantially in a middle of the second side face in an orthogonal direction from the first edge and at a distance from the second side face;

a plurality of first wires, wherein first ends of the first wires are fastened in a first fastening region on the first side face of the stack, and wherein second ends of the first wires are fastened at the first contact pin;

a second contact pin arranged parallel to the stacking direction, wherein the second contact pin is substantially in a middle of the further second side face in an orthogonal direction to the second edge and at a distance from the further second side face; and a plurality of second wires, wherein first end of the second wires are fastened in a second fastening region on the further first side face of the stack, and wherein second ends of the second wires are fastened at the second contact pin.

17. The piezoelectric actuator according to claim 16, further comprising a cast encapsulating the stack and the first and second contact pins.

18. The piezoelectric actuator according to claim 17, wherein the cast comprises a casting compound and a plastic sleeve.

19. The piezoelectric actuator according to claim 16, further comprising a passivation layer disposed on the first and second side faces, and the further first and second side faces.

\* \* \* \* \*